United States Patent
Keller et al.

(10) Patent No.: US 7,143,374 B1
(45) Date of Patent: Nov. 28, 2006

(54) SYSTEM AND METHOD FOR ACHIEVING ANALYSIS CAPACITY FOR CIRCUIT ANALYSIS TOOLS

(75) Inventors: S. Brandon Keller, Skowhegan, ME (US); Gregory Dennis Rogers, Fort Collins, CO (US); George Harold Robbert, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/068,992

(22) Filed: Mar. 1, 2005

(51) Int. Cl.
G06F 17/50 (2006.01)
G06F 9/45 (2006.01)

(52) U.S. Cl. .................. 716/4; 716/5; 716/7
(58) Field of Classification Search .......... 716/4, 716/7, 5
See application file for complete search history.

(56) References Cited

U.S. PATENT DOCUMENTS

| | | | |
|---|---|---|---|
| 5,734,798 A * | 3/1998 | Allred | 706/47 |
| 6,470,489 B1 * | 10/2002 | Chang et al. | 716/21 |
| 6,560,758 B1 * | 5/2003 | Jain | 716/7 |
| 2003/0131325 A1 * | 7/2003 | Schubert et al. | 716/4 |
| 2003/0212970 A1 * | 11/2003 | Stong | 716/5 |
| 2004/0044509 A1 * | 3/2004 | Demler et al. | 703/14 |
| 2004/0139409 A1 * | 7/2004 | Nagasawa et al. | 716/5 |
| 2004/0230928 A1 * | 11/2004 | Nozuyama | 716/5 |
| 2005/0097433 A1 * | 5/2005 | D'Arcy et al. | 714/807 |
| 2005/0251767 A1 * | 11/2005 | Shah et al. | 716/4 |

* cited by examiner

*Primary Examiner*—Paul Dinh
*Assistant Examiner*—Suresh Memula

(57) ABSTRACT

A system, method and software product achieve analysis capacity for circuit analysis tools. One or more stages of a circuit design are identified. One or more descriptions of the stages are stored. Stage results are generated by independently analyzing each stage based upon the descriptions. Stage results from analyzed stages are combined to produce a single result set for the circuit design.

9 Claims, 6 Drawing Sheets

SYSTEM AND METHOD FOR ACHIEVING ANALYSIS CAPACITY FOR CIRCUIT ANALYSIS TOOLS

BACKGROUND

An electronic computer aided design ("E-CAD") package is utilized to construct a Very Large Scale Integration ("VLSI") circuit design. The VLSI circuit design consists of a netlist that identifies electronic design elements (e.g., capacitors, transistors, resistors, etc.) and their interconnectivity (e.g., signal nets) within the VLSI circuit design.

A significant characteristic of VLSI and other types of circuit design is a reliance on hierarchical description. A primary reason for using hierarchical description is to hide the vast amount of detail in a design. By reducing the distracting detail to a single object that is higher in the hierarchy, one can greatly simplify many E-CAD operations. For example, simulation, verification, design-rule checking, and layout constraints can all benefit from hierarchical representation, which makes them more computationally tractable. Since many circuit designs are too complicated to be easily considered in their totality, a complete design is often viewed as a collection of design element aggregates that are further divided into sub-aggregates in a recursive and hierarchical manner. In VLSI circuit design, these aggregates are commonly referred to as design blocks or cells. The use of a design block at a given level of hierarchy is called an 'instance'.

Design blocks may be constructed from electronic design elements, signal nets and other design blocks, and may be used one or more times within the VLSI circuit design. Each design block has one or more 'ports', each of which provides a connection point between a signal net within the design block and a signal net external to the design block.

During development, a design engineer uses an E-CAD tool to analyze the VLSI circuit design. The E-CAD tool traces through instances of blocks used in the VLSI circuit design, to detect problems with the VLSI circuit design, by applying instantiation-specific characteristics (e.g., switching frequencies and scaling factors) to the analysis. During this analysis, the E-CAD tool therefore analyzes information for each re-used design block many times, each instance of the re-used design block being individually processed. If the VLSI circuit design has billions of design elements, the analysis can take hours or even days of processing time to complete, resulting in lost productivity. Continuous lost productivity due to lengthy engineering development slows technology advancement and can result in significant costs, as well as lost business.

Reliability of the VLSI design is also a key factor to product success. Electromigration and self-heating analyses help ensure this reliability. Because VLSI circuit electromigration analysis tools perform analysis on the entire hierarchy of the VLSI design, the maximum design size that may be analyzed is limited due to associated large data file sizes. Accordingly, as VLSI designs increase in size, analysis tools cannot properly analyze the large amounts of data.

SUMMARY

In one embodiment, a system achieves analysis capacity for circuit analysis tools. One or more stages of a circuit design are identified. One or more descriptions of the stages are stored. Stage results are generated by independently analyzing each stage based upon the descriptions. Stage results from analyzed stages are combined to produce a single result set for the circuit design.

In another embodiment, a software product has instructions, stored on computer-readable media, wherein the instructions, when executed by a computer, perform steps for achieving analysis capacity in circuit design analysis tools, including: instructions for identifying stages of the circuit design; instructions for storing a description of each of the stages in a stage database; instructions for independently analyzing each of the stages based upon stage descriptions, to generate stage results; and instructions for combining stage results as a result set.

In another embodiment, a system achieves analysis capacity in circuit design analysis tools, including: means for identifying at least two stages of the circuit design; means for storing a description of each of the stages; means for independently analyzing each of the stages based upon at least one stored stage description; and means for combining results from independently analyzed stages into a result set.

DETAILED DESCRIPTION OF THE FIGURES

To analyze a circuit design, the circuit design may be partitioned into one or more sub-circuit "stages" that are independently analyzed. Each stage includes one or more signal nets between driver and receiver FETs, including pass FETs. Each stage is described such that an analysis tool (e.g., an electromigration analysis tool and/or a self-heating analysis tool) may load and analyze the stage without necessarily loading the entire circuit design. Further information about stage descriptions may be found in co-filed U.S. Patent application Ser. No. 11/069,347 titled 'System and method for compactly describing a stage of a circuit design' inventors S. Brandon Keller, Gregory Dennis Rogers and George Harold Robbert), incorporated herein by reference.

Results of independently analyzed stages may then be collected into a single set of results for the entire circuit design, to obtain summary results for the circuit design independent of stage partitioning. Accuracy of these results may be equivalent to results obtained by analysis of the entire circuit.

Once a circuit design is partitioned into stages, each stage may be analyzed by one or more identical analysis tools in a distributed network, such as described in co-filed U.S. Patent application Ser. No. 11/069,347 titled 'Method and apparatus for managing reliable distribution of compute tasks in a heterogeneous distributed compute environment' inventors S. Brandon Keller, Gregory Dennis Rogers and George Harold Robbert), incorporated herein by reference. Since each stage may be analyzed independently, algorithmic capacity of the analysis tools need only be sufficient to handle the selected stage(s).

The following embodiments illustrate partitioning a circuit design into one or more stages for analysis and then the combination of analysis results into a single result set.

Figure 1:
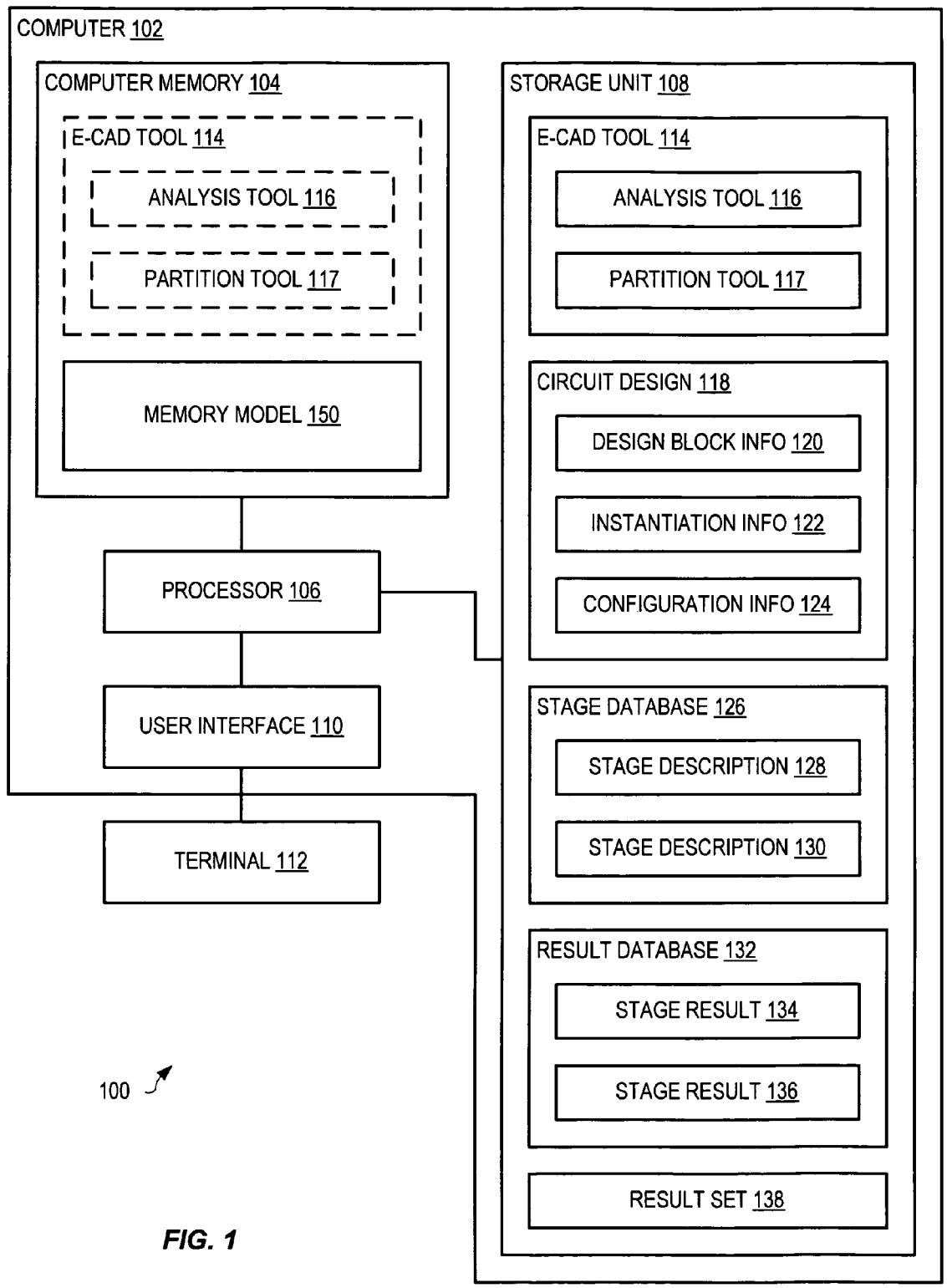
FIG. 1 shows a block diagram of a system embodiment for achieving analysis capacity for circuit analysis tools.

In particular, FIG. 1 shows a block diagram of a system 100 for achieving analysis capacity for circuit analysis tools, such as an analysis tool 116 (e.g., an electromigration analysis tool and/or a self-heating analysis tool) as part of an electronic-computer aided design ("E-CAD") tool 114. System 100 is shown with a computer 102 and a terminal 112. Computer 102 has a computer memory 104, a storage unit 108, a processor 106 and a user interface 110. Storage unit 108 is, for example, a hard disk drive or other non-volatile storage media. Storage unit 108 is shown with E-CAD tool 114 and a circuit design 118. Circuit design 118 may be created by E-CAD tool 114, for example, and may represent a hierarchical circuit design (e.g., a very large scale integration ("VLSI") circuit design) for a semiconductor device.

In the illustrated example of FIG. 1, circuit design 118 is shown with design block information 120, instantiation information 122 and configuration information 124. Design block information 120 contains definitions of each design block of circuit design 118; instantiation information 122 specifies instantiation information for each instantiated design block of circuit design 118; and configuration information 124 defines instantiation-specific configuration information for each instantiated design block of circuit design 118.

E-CAD tool 114 is also shown with a partition tool 117. Processor 106 operates to load part or all of E-CAD tool 114, analysis tool 116 and partition tool 117 into computer memory 104 (each shown in dashed outline within memory 104 for purposes of illustration).

In one example of operation, partition tool 117 is executed by processor 106 to identify stages for analysis within circuit design 118. Partition tool 117 generates one or more stage descriptions (shown illustratively as stage descriptions 128 and 130) that may be, for example, stored in a stage database 126. Analysis tool 116 may then sequentially load and analyze stage descriptions 128 and 130 of stage database 126 into memory 104 without loading all of circuit design 118 into memory 104.

By way of illustrative operation, analysis tool 116 analyzes stage description 128 to produce stage result 134 and analyzes stage description 130 to produce stage result 136. In this example, stage results 134 and 136 are shown within a result database 132; however, stage results 134 and 136 may be stored elsewhere. After analysis tool 116 completes analysis of stage descriptions 128 and 130, analysis tool 116 or E-CAD tool 114 may combine stage results 134 and 136 into a result set 138. It may not be apparent that result set 138 resulted from partitioning of circuit design 118 into stages.

A user may interact with E-CAD tool 114 and analysis tool 116 though terminal 112 and user interface 110, for example, to invoke analysis of circuit design 118 and to view result set 138.

Figure 2:
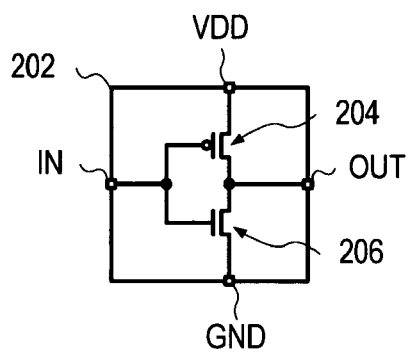
FIG. 2 is a schematic diagram illustrating one exemplary design block that includes two field-effect transistors ("FETs") configured to operate as an inverter.

FIG. 2, FIG. 3, FIG. 4 and FIG. 5 illustrate partitioning of design block information (e.g., design block information 120) and instantiation information (e.g., instantiation information 122) into stages. In particular, FIG. 2 is a schematic diagram illustrating an exemplary design block 202 that includes two field-effect transistors ("FETs") 204 and 206 configured to operate as an inverter. Design block 202 may, for example, be part of circuit design 118, FIG. 1. Design block 202 may be included in a library of design blocks (not shown) for inclusion into other circuit designs.

Design block 202 is shown with a ported input signal net IN, a ported output signal net OUT, and two ported power nets VDD and GND, as shown. Design block 202 may represent a design block of design block information 120, FIG. 1, for example, and may be instantiated one or more times in circuit design 118.

Figure 3:
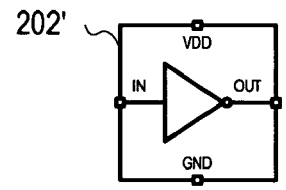
FIG. 3 shows a simplified illustration of the design block of FIG. 2.

FIG. 3 shows design block 202, FIG. 2, in a simplified format (for purposes of illustration) as a design block 202'. Design block 202' has the functionality of design block 202, FIG. 2.

Figure 4:
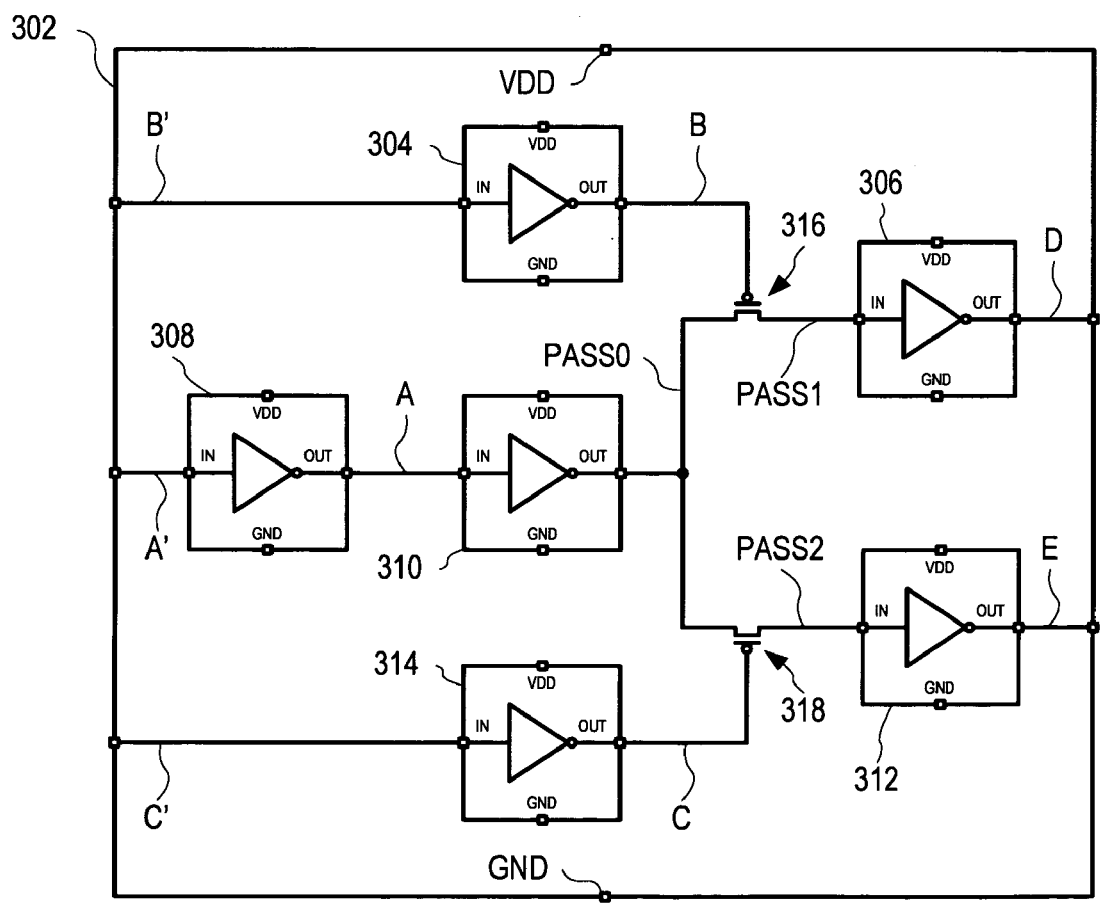
FIG. 4 shows a design block with six instantiations of the design block of FIG. 3 and two pass FETs.

FIG. 4 shows a design block 302 with six instantiations of design block 202', FIG. 3, shown as instantiated blocks 304, 306, 308, 310, 312 and 314, and two pass FETs 316 and 318. Connections to and between ported power nets VDD of instantiated blocks 304, 306, 308, 310, 312 and 314 and ported power net VDD of design block 302 are not shown for clarity of illustration. Similarly, connections to and between ported power nets GND of instantiated blocks 304, 306, 308, 310, 312 and 314 and ported power net GND of design block 302 are not shown for clarity of illustration.

Design block 302 has three ported input signal nets A', B' and C', and two ported output signal nets D and E. Ported input signal net A' connects to ported input signal net IN of instantiated block 308. Ported output signal net OUT of instantiated block 308 connects to internal signal net A of design block 302. Signal net A connects to ported input signal net IN of instantiated block 310. Signal net OUT of instantiated block 310 connects to a signal net PASS0 of design block 302, which connects to drain terminals of pass FETs 316 and 318. Ported input signal net B' connects to ported input signal net IN of instantiated block 304. Ported output signal net OUT of instantiated block 304 connects to internal signal net B of design block 302, which connects to a gate terminal of pass FET 316. Ported input signal net C' connects to ported input signal net IN of instantiated block 314. Ported output signal net OUT of instantiated block 314 connects to internal signal net C of design block 302, which connects to a gate terminal of pass FET 318. A source terminal of pass FET 316 connects to internal signal net PASS1 of design block 302, which connects to ported input signal net IN of instantiated block 306. Ported output signal net OUT of instantiated block 306 connects to ported output signal net D. A source terminal of pass FET 318 connects to internal signal net PASS2 of design block 302, which connects to ported input signal net IN of instantiated block 312. Ported output signal net OUT of instantiated block 312 connects to ported output signal net E.

Figure 5:
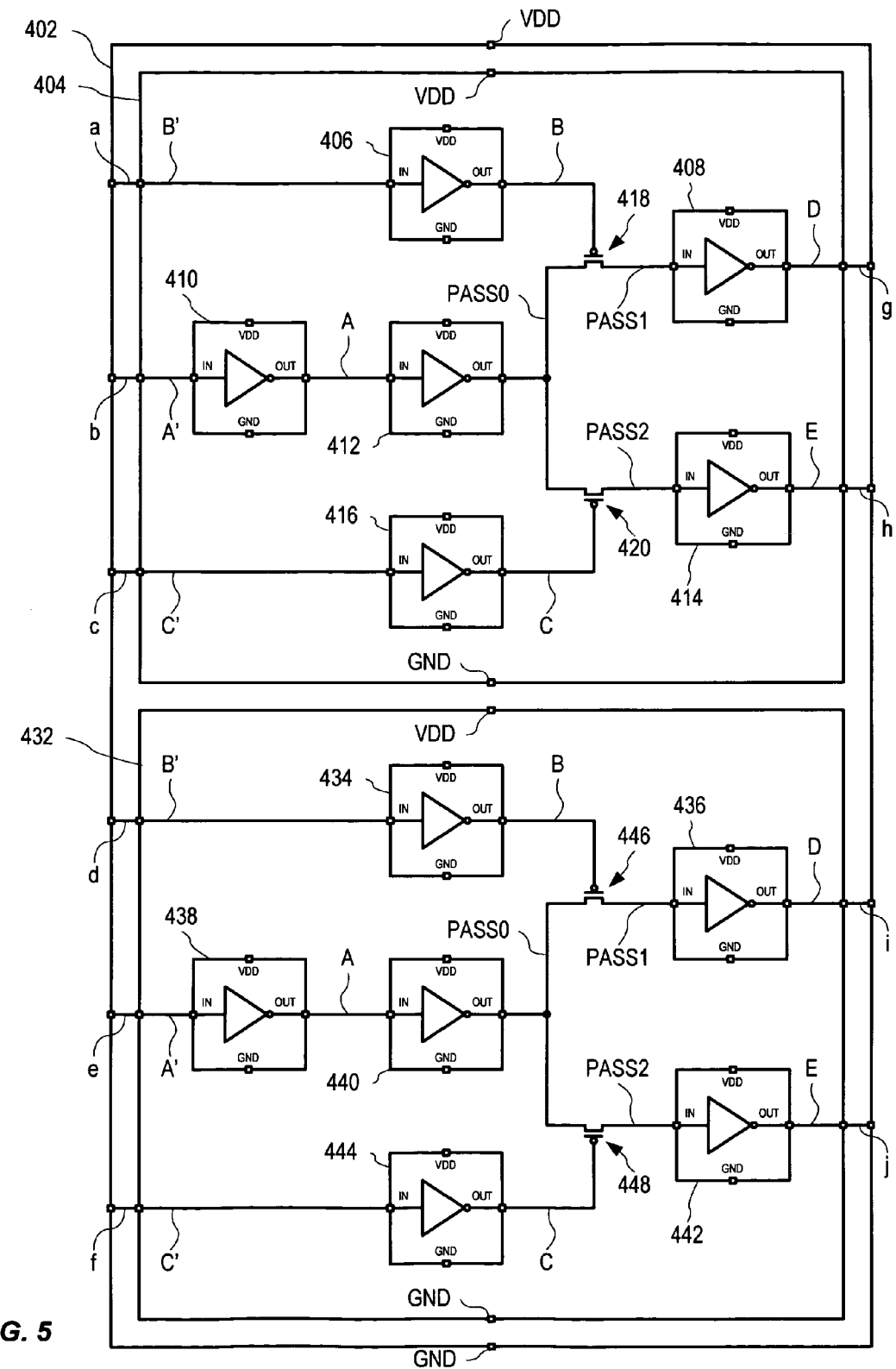
FIG. 5 shows a design block with two instantiations of the design block of FIG. 4.

FIG. 5 shows a design block 402 with two instantiations of design block 302, FIG. 4, shown as instantiated blocks 404 and 432. Connections to and between ported power nets VDD of instantiated blocks 404 and 432 and ported power net VDD of design block 402 are not shown for clarity of illustration. Similarly, connections to and between ported power nets GND of instantiated blocks 404 and 432 and ported power net GND of design block 402 are not shown for clarity of illustration.

Ported signal net B' of instantiated block 404 connects to ported signal net a of design block 402; ported signal net A' of instantiated block 404 connects to ported signal net b of design block 402; ported signal net C' of instantiated block 404 connects to ported signal net c of design block 402; ported signal net D of instantiated block 404 connects to ported signal net g of design block 402; and ported signal net E of instantiated block 404 connects to ported signal net h of design block 402. Ported signal net B' of instantiated block 432 connects to ported signal net d of design block 402; ported signal net A' of instantiated block 432 connects to ported signal net e of design block 402; ported signal net C' of instantiated block 432 connects to ported signal net f of design block 402; ported signal net D of instantiated block 432 connects to ported signal net i of design block 402; and ported signal net E of instantiated block 432 connects to ported signal net j of design block 402.

A stage is contained within one instantiated block of circuit design 118, FIG. 1. For example, signal net A' is not included in a stage within instantiated block 404 or design block 402 since signal net A' is ported out of instantiated block 404 and connects to signal net b, which is ported out of design block 402. However, signal nets b and A' may be included within a stage of a block instantiated at a higher hierarchical level in the circuit design.

In one example of operation, partition tool 117 operates to partition instantiated block 404 into stages. Partition tool 117 first identifies non-ported nets (i.e., internal nets) that exist at any level of design block 402. For example, in instantiated block 404, partition tool 117 identifies signal nets A, B, C, PASS0, PASS1 and PASS2 of instantiated block 404, and signal nets A, B, C, PASS0, PASS1 and PASS2 of instantiated block 432.

For each of these identified signal nets, connections are traversed, crossing any encountered FETs that connect to the signal net (known as "channel connected"), until a power rail (VDD or GND) or a gate connection of a FET is encountered. The traversed signal nets between driver FETs and receiver FETs, including nets connected through pass transistors, are identified as a stage. For example, in tracing signal net A, FETs 204 and 206 (see FIG. 2) of instantiated block 410 are traversed to reach VDD and GND, respectively, where the trace stops; the tracing also continues until it reaches gate terminals of FETS 204 and 206 of instantiated block 412. Thus, signal net A of instantiated block 404 defines one stage. Similarly, signal nets B and C define other stages.

Signal nets PASS0, PASS1 and PASS2 define a fourth stage in instantiated block 404. In particular, signal net PASS0 traces through pass FET 418 to signal net PASS1, which in turn traces and stops at gate terminals of FETs 204 and 206 of instantiated block 408. Signal net PASS0 traces through pass FET 420 to signal net PASS2, which in turn traces and stops at gate terminals of FETs 204 and 206 of instantiated block 414.

In one embodiment, analysis tool 116 operates to sequentially analyze each stage identified by partitioning tool 117. In another embodiment, one or more of these stages may be distributed across a network for analysis by one or more copies of analysis tool 116 that are running on other processors; after analysis, results returned by the copies are combined into result set 138.

During analysis of a stage, analysis tool 116 may, for example, load resistance (R) and capacitance (C) information for each signal net of the stage from configuration information 124 of circuit design 118. This loading is facilitated by information stored within each stage description (e.g., stage descriptions 128, 130) of stage database 126, allowing information specific to each identified stage to be loaded directly from circuit design 118. Analysis tool 116 may thus analyze each identified stage independently, without loading the entire circuit design 118 into memory 104.

Analysis capacity of analysis tool 116 is therefore not limited by the size of circuit design 118, but rather by the size of loaded stages.

Analysis tool 116 produces stage results (e.g., stage results 134, 136) for each analyzed stage. These stage results may then be combined to form a single set of results for circuit design 118, for example as result set 138.

An exemplary algorithm to identify stages within circuit design 118 is shown as pseudo-code in Code Sample 1—Identify Stages below.

Code Sample 1—Identify Stages for each block of the circuit design
  for each net in the block
    if net is not ported and not channel connected to a port or supply
      if net is not part of a previously identified stage
        found internal net and working block for a stage Accordingly, since design block 302 is identically instantiated as instantiated blocks 404 and 432, it is not necessary to specifically trace instantiated block 432 since stages of instantiated block 432 are identical to those of instantiated block 404.

Figure 6:
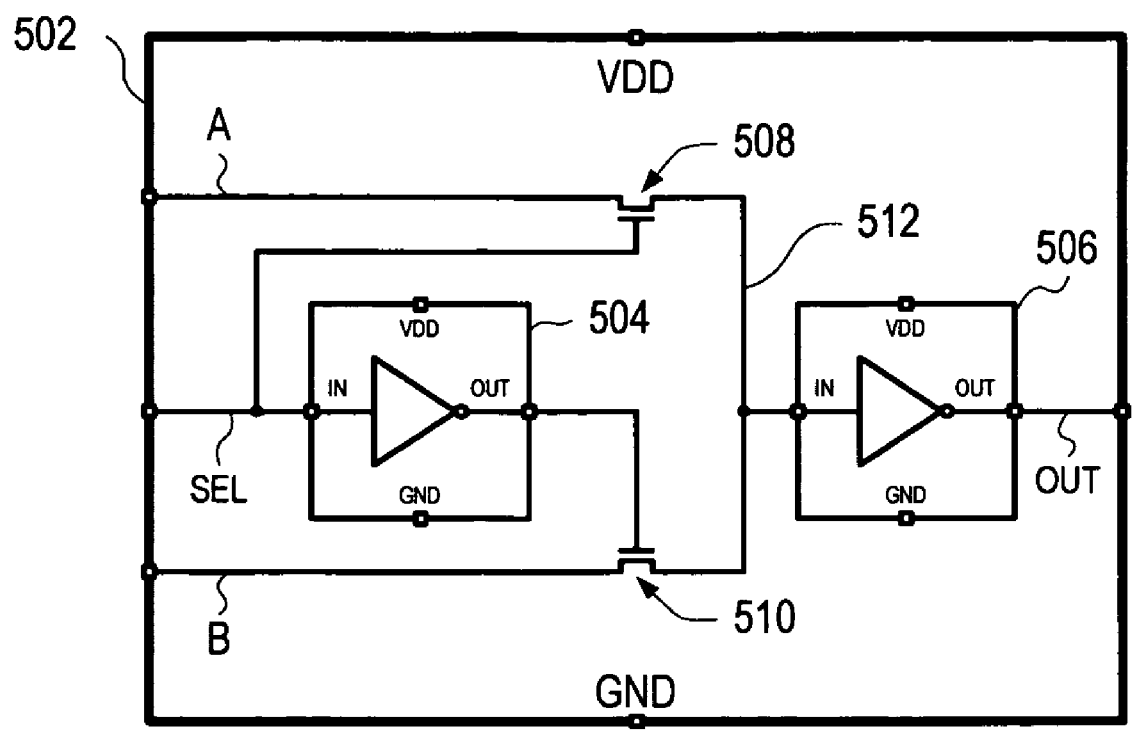
FIG. 6 shows a design block that has two instantiations of the design block of FIG. 3.
Figure 7:
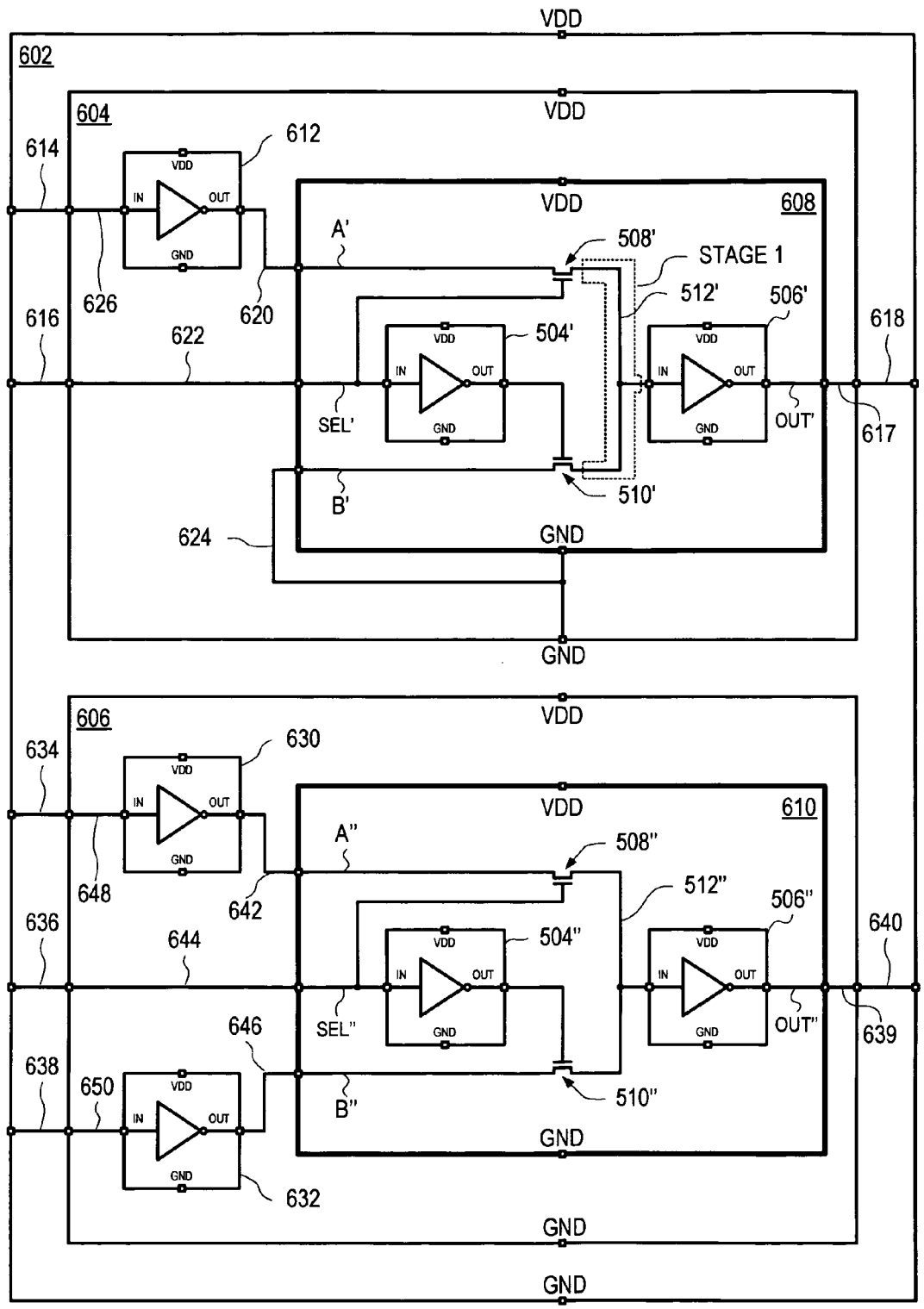
FIG. 7 shows a design block with one instantiation of the design block of FIG. 6.

Partition tool 117 may also handle special connectivity issues when partitioning circuit design 118 into stages 128, 130. For example, as shown in FIGS. 6 and 7, where a ported power net of an instantiated block within a design block connects to a ported signal net of the design block, partition tool 117 may trace the ported signal net to higher levels of circuit design 118 to determine if the ported signal net terminates at a power net. Partition tool 117 may also handle certain anomalies when identifying stages within circuit design 118. FIG. 6 and FIG. 7 describe a circuit configuration containing one such anomaly.

In particular, FIG. 6 shows a design block 502 that has two instantiations of design block 202', FIG. 3, shown as instantiated blocks 504 and 506, and two pass FETs 508 and 510. Design block 502 may, for example, represent a two input multiplexer. A ported input signal net A of design block 502 connects to a first terminal of pass FET 508. A ported input signal net B of design block 502 connects to a first terminal of pass FET 510. A ported input signal net SEL of design block 502 connects to a gate terminal of pass FET 508 and to a ported input signal net IN of instantiated block 504. An ported output signal net OUT of instantiated block 504 connects to a gate terminal of pass FET 510. A second terminal of pass FET 508, a second terminal of pass FET 510 and a ported input signal net IN of instantiated block 506 are connected together by an internal signal net 512 of design block 502. Ported output signal net OUT of instantiated block 506 connects to a ported output signal net OUT of design block 502. Ported power net VDD of instantiated block 504 connects to a ported power net VDD of design block 502, and ported power net GND of instantiated block 504 connects to a ported power net GND of design block 502. Ported power net VDD of instantiated block 506 connects to ported power net VDD of design block 502, and ported power net GND of instantiated block 506 connects to ported power net GND of design block 502. From design block 502, it cannot be immediately determined if internal signal net 512 is a stage within design block 502, since tracing internal signal net 512 through pass FETs 508 and 510 determines that signal net 512 connects to ported signal nets A and B, respectively (i.e., the trace does not terminate at a power net or at a driver FET).

FIG. 7 shows a design block 602 with two instantiations 604 and 606 of exemplary design blocks that instantiate design block 502, FIG. 6 and design block 202', FIG. 3. In particular, instantiated block 604 contains one instantiation of design block 502, shown as instantiated block 608, and one instantiation of design block 202', shown as instantiated block 612. Instantiated block 606 contains one instantiation of design block 502, shown as instantiated block 610, and two instantiations of design block 202', shown as instantiated blocks 630 and 632.

A ported input signal net 614 of design block 602 connects to a ported input signal net 626 of instantiated block 604, which in turn connects to ported input signal net IN of instantiated block 612. A ported output signal net OUT of instantiated block 612 connects to a ported input signal net A' of instantiated block 608. A ported input signal net 616 of design block 602 connects to a ported input signal net 622 of instantiated block 604, which in turn connects to a ported input signal net SEL' of instantiated block 608. A ported output signal net OUT' of instantiated block 608 connects to a ported output signal net 617 of instantiated block 604, which in turn connects to a ported output signal net 618 of design block 602. A ported input signal net B' of instantiated block 608 connects to GND of instantiated block 604.

A ported input signal net 634 of design block 602 connects to a ported input signal net 648 of instantiated block 606, which in turn connects to ported input signal net IN of instantiated block 630. A ported output signal net OUT of instantiated block 630 connects to a ported input signal net A" of instantiated block 610. A ported input signal net 636 of design block 602 connects to a ported input signal net 644 of instantiated block 606, which in turn connects to a ported input signal net SEL" of instantiated block 610. A ported input signal net 638 of design block 602 connects to a ported input signal net 650 of instantiated block 606, which in turn connects to ported input signal net IN of instantiated block 632. A ported output signal net OUT of instantiated block 632 connects to a ported input signal net B" of instantiated block 610. A ported output signal net OUT" of instantiated block 610 connects to a ported output signal net 639 of instantiated block 606, which in turn connects to a ported output signal net 640 of design block 602.

Although not all power connections are shown in FIG. 7, ported power net VDD of design block 602 connects to each ported power net VDD of instantiated blocks 604, 606, 608, 610, 612, 630, 632, 504', 506', 504" and 506". Similarly, ported power net GND of design block 602 connects to each ported power net GND of instantiated blocks 604, 606, 608, 610, 612, 630, 632, 504', 506', 504" and 506".

During analysis of instantiated block 608, partition tool 117 determines that signal net 512' connects to signal net B' through pass FET 510', and thus is ported into design block 604. Partition tool 117 therefore continues the trace into instantiated block 604 and determines that ported input signal net B' connects to power net GND by connection 624. Thus, in this example, partition tool 117 determines that signal net 512' is a stage (shown as STAGE 1 in FIG. 7) within instantiated block 608. In particular, pass FET 510' is connected to power net GND and therefore operates as a driver FET within instantiated block 608, making signal net 512' a stage.

During analysis of instantiated block 610, partition tool 117 determines that signal net 512" connects to signal net B" through pass FET 510", and thus is ported into design block 606. Partition tool 117 therefore continues the trace into instantiated block 606 and determines that ported input signal net B" does not connect to a power net, and signal net 512" is therefore not a stage of instantiated block 610. It should be noted that signal net 512", signal net B" and signal net 646 are, however, identified as a stage during analysis of instantiated block 606.

Figure 8:
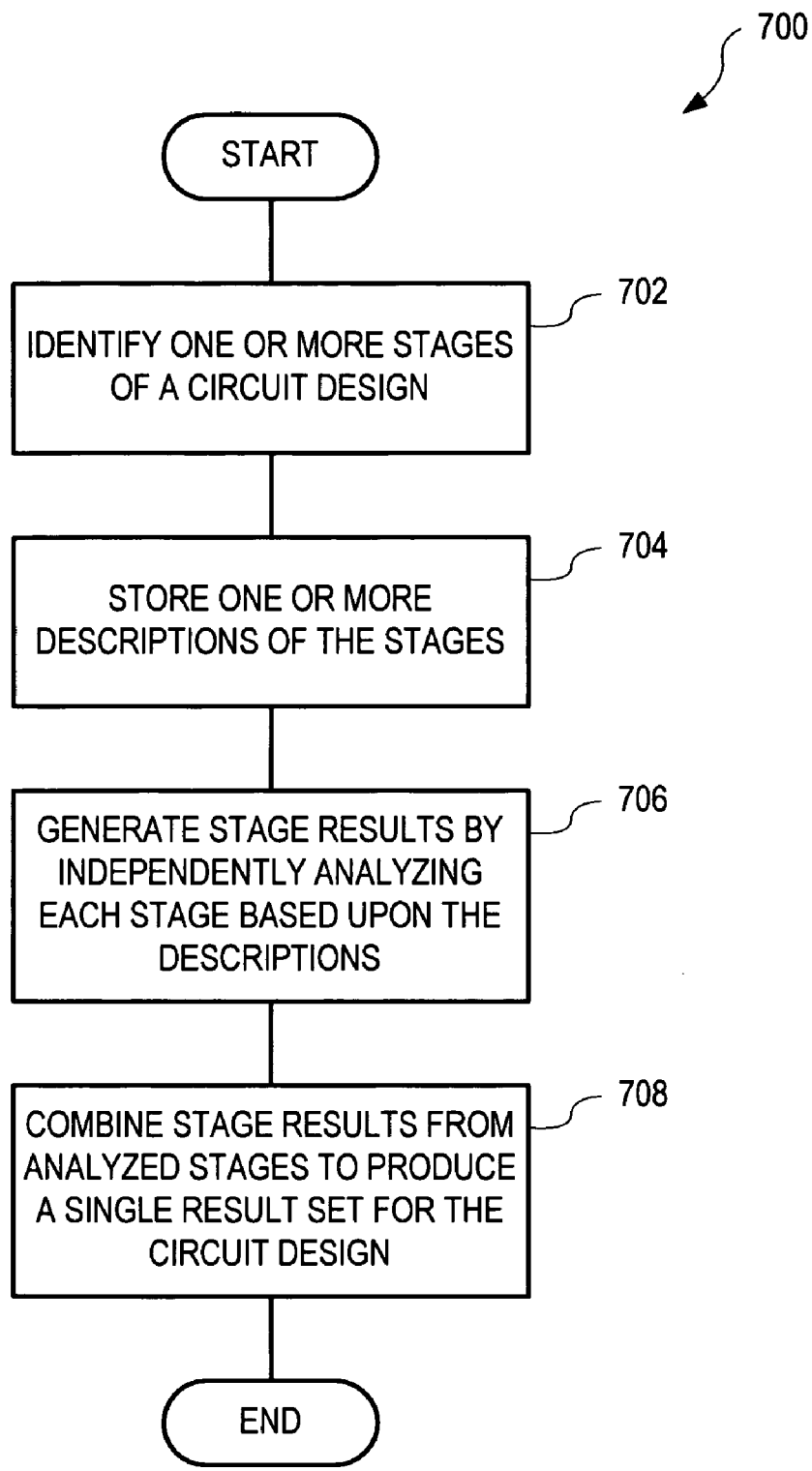
FIG. 8 is a flowchart illustrating one exemplary process embodiment for achieving analysis capacity for circuit analysis tools.

FIG. 8 is a flowchart illustrating one exemplary process 700 for achieving analysis capacity in VLSI electromigration analysis tools. Process 700 is, for example, implemented by partition tool 117, FIG. 1.

In step 702, process 700 identifies one or more stages (e.g., STAGE 1) of a circuit design (e.g., circuit design 118). In one example of step 702, process 700 traces signal net 512 of design block 502 and identifies STAGE 1 within instantiated block 608. In step 704, process 700 stores one or more descriptions (e.g., stage descriptions 128, 130) of the stages. In one example of step 704, process 700 stores stage description 128 of STAGE 1 in stage database 126. In step 706, process 700 generates stage results (e.g., stage results 134, 136) by independently analyzing each stage based upon the descriptions. In one example of step 706, process 700 analyzes STAGE 1 based upon stage description 128 in stage database 126 to generate stage results 134. In step 708, process 700 combines stage results from analyzed stages of step 706 to produce a single result set for the circuit design. In one example of step 708, process 700 combines stage results 134 and 136 into result set 138.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. A method for achieving analysis capacity for circuit analysis tools, comprising:
   determining non-ported nets within each block of the circuit design;
   traversing from each non-ported net through any FET connected to the non-ported net until a power rail is encountered, until a FET gate terminal is encountered or until a port is encountered;
   defining traversed nets as a stage if no port is encountered;
   storing one or more descriptions of each stage;
   generating stage results by independently analyzing each stage based upon the descriptions; and
   combining stage results from analyzed stages to produce a single result set for the circuit design.

2. The method of claim 1, the step of traversing further comprising:
   tracing ported signal nets connected to the non-ported nets to a higher hierarchical level in the circuit design; and
   identifying the connected signal nets as a stage if all ported signal nets terminate at a power net.

3. The method of claim 1, the step of storing comprising storing a text description of each of the stages.

4. A software product comprising instructions, stored on computer-readable media, wherein the instructions, when executed by a computer, perform steps for achieving analysis capacity in circuit design analysis tools, comprising:
   instructions for determining non-ported nets within each block of the circuit design;
   instructions for traversing from each non-ported net through any FET connected to the non-ported net until a power rail is encountered, until a FET gate terminal is encountered or until a port is encountered;

instructions for defining traversed nets as a stage if no port is encountered;

instructions for storing a description of each stage in a stage database;

instructions for independently analyzing each of stage based upon stage descriptions, to generate stage results; and instructions for combining stage results as a result set.

5. The software product of claim 4, the instructions for traversing further comprising:

instructions for tracing ported signal nets connected to the non-ported nets to a higher hierarchical level in the circuit design; and instructions for identifying the connected signal nets as a stage if all ported signal nets terminate at a power net.

6. The software product of claim 4, the instructions for storing comprising instructions for storing a text description of each of the stages.

7. A system for achieving analysis capacity in circuit design analysis tools, comprising:

means for determining non-ported nets within each block of the circuit design;

means for traversing from each non-ported net through any FET connected to the non-ported net until a power rail is encountered, until a FET gate terminal is encountered or until a port is encountered;

means for defining traversed nets as a stage if no port is encountered;

means for storing a description of each stage;

means for independently analyzing each stage based upon at least one stored stage description; and means for combining results from independently analyzed stages into a result set.

8. The system of claim 7, the means for traversing further comprising:

means for tracing ported signal nets connected to the non-ported nets to a higher hierarchical level in the circuit design; and means for identifying the connected signal nets as a stage if all ported signal nets terminate at a power net.

9. The system of claim 7, the means for storing comprising means for storing a text description of each of the stages.

* * * * *